(12) United States Patent
Ukawa et al.

(10) Patent No.: US 7,671,146 B2
(45) Date of Patent: Mar. 2, 2010

(54) EPOXY RESIN COMPOSITION FOR ENCAPSULATING SEMICONDUCTOR AND SEMICONDUCTOR DEVICE

(75) Inventors: Ken Ukawa, Tokyo (JP); Hirofumi Kuroda, Tokyo (JP)

(73) Assignee: Sumitomo Bakelite Company, Ltd, Tokyo (JP)

( * ) Notice: Subject to any disclaimer, the term of this patent is extended or adjusted under 35 U.S.C. 154(b) by 205 days.

(21) Appl. No.: 11/713,598

(22) Filed: Mar. 5, 2007

(65) Prior Publication Data

US 2007/0213477 A1    Sep. 13, 2007

(30) Foreign Application Priority Data

Mar. 7, 2006    (JP) ............... 2006-061934
Dec. 21, 2006    (JP) ............... 2006-345051

(51) Int. Cl.
*C08G 59/14* (2006.01)
(52) U.S. Cl. ............... 525/523; 528/88; 528/93
(58) Field of Classification Search ............ 525/481
See application file for complete search history.

(56) References Cited

U.S. PATENT DOCUMENTS 3,360,525 A * 12/1967 Frye ............... 546/14

2004/0232532 A1 * 11/2004 Kuroda ............... 257/678

FOREIGN PATENT DOCUMENTS

| JP | 1-275618 | 11/1989 |
|---|---|---|
| JP | 5-97965 | 4/1993 |
| JP | 5-97967 | 4/1993 |
| JP | 8-120057 | 5/1996 |
| JP | 8-143648 | 6/1996 |
| JP | 11-140144 | 5/1999 |
| JP | 11-171970 | 6/1999 |
| JP | 2002-179761 | 6/2002 |
| JP | 2002-338656 | 11/2002 |
| JP | 2003-171444 | 6/2003 |
| JP | 2003-213084 | 7/2003 |
| JP | 2004-107584 | 4/2004 |
| JP | 2006-233190 | 9/2006 |
| JP | 2006-307131 | 11/2006 |

* cited by examiner

*Primary Examiner*—Randy Gulakowski
*Assistant Examiner*—Shane Fang
(74) *Attorney, Agent, or Firm*—Smith, Gambrell & Russell, LLP (57) ABSTRACT

This invention provides an epoxy resin composition for encapsulating a semiconductor exhibiting higher flame resistance, good flowability and adequately higher solder-reflow resistance to allow for the use of a lead-free solder without a flame retardant, as well as a highly reliable semiconductor device in which a semiconductor element is encapsulated with a cured product from the composition.

7 Claims, 1 Drawing Sheet

FIG.1

EPOXY RESIN COMPOSITION FOR ENCAPSULATING SEMICONDUCTOR AND SEMICONDUCTOR DEVICE

This application is based on Japanese patent application Nos. 2006-061934, and 2006-345051, the contents of which are incorporated hereinto by reference.

BACKGROUND

1. Technical Field

The present invention relates to an epoxy resin composition for encapsulating a semiconductor and a semiconductor device therewith.

2. Related Art

Electronic components such as diodes, transistors and integrated circuits have been typically encapsulated with an epoxy resin composition. Particularly, in integrated circuits, there have been used epoxy resin compositions exhibiting excellent heat resistance and moisture resistance containing an epoxy resin, a phenol resin curing agent and inorganic fillers such as fused silica and crystalline silica. However, recent market trend to size reduction, weight saving and higher performance in electronic devices has led to more integrated semiconductors and accelerated surface mounting of a semiconductor device, while requirements to be met by an epoxy resin composition used for encapsulating a semiconductor element has been increasingly diversified and stricter. In particular, now that surface mounting of a semiconductor device is common, a moistened semiconductor device is exposed to a high temperature during a solder reflow process. Furthermore, as part of eliminating environment burden materials, a solder free from lead has been increasingly used as an alternative material, but a lead-free solder has a higher melting point than a conventional solder. Therefore, it needs a reflow temperature during surface mounting higher by about 20° C. than a conventional case, specifically 260° C. Thus, a semiconductor device is exposed to a further higher temperature, causing de-lamination of a cured epoxy resin composition in its interface with a semiconductor element or lead frame. It tends to defects significantly deteriorating reliability in a semiconductor device such as cracks.

Furthermore, also from environmental considerations, there is a move to limit the use of a halogen-containing flame retardant such as bromine-containing organic compounds and an antimony compound such as diantimony trioxide and diantimony tetroxide which have been used as a flame retardant for a semiconductor encapsulating material, and there has been needed alternative flame resisting means. As alternative flame resisting means for a semiconductor encapsulating material, there has been proposed the use of metal hydroxides such as aluminum hydroxide and magnesium hydroxide. They must be, however, used in a large amount for effectively working as a flame retardant, and when being used in an enough amount to be a flame retardant, it may deteriorate flowability and curability of an epoxy resin composition during molding, mechanical strength of a cured material and thus solder-reflow resistance in a temperature range for mounting the above lead-free solder.

To solve these problems, there have been proposed using a low water-absorbing, flexible and flame-resistant resin for meeting the requirements for both solder reflow resistance and flame resistance (See, for example, Japanese Patent Application Laid Open Nos. 1989-275618, 1993-097965 and 1993-097967). However, there have been needed further higher solder-reflow resistance while recently a semiconductor has been further thinner and interconnections have been further finer, so that improvement in flowability during encapsulating and molding. It has been, therefore, difficult to meet all of these requirements.

Given such circumstances, there has been needed for developing a resin composition for encapsulating a semiconductor exhibiting higher flame resistance, good flowability and adequately higher solder-reflow resistance to allow for the use of a lead-free solder without a flame retardant.

Thus, this invention provides an epoxy resin composition for encapsulating a semiconductor exhibiting higher flame resistance, good flowability and adequately higher solder-reflow resistance to allow for the use of a lead-free solder without a flame retardant, as well as a highly reliable semiconductor device in which a semiconductor element is encapsulated with a cured product from the composition.

SUMMARY OF THE INVENTION

The present invention provides the followings.

[1] An epoxy resin composition for encapsulating a semiconductor comprising

(A) an epoxy resin represented by general formula (1), wherein a binuclear compound (a component in which n=1 in general formula (1)) is contained in a ratio of 60% to 100% both inclusive as determined by a GPC (Gel Permeation Chromatography) area ratio, and a binuclear compound in which the bis (phenylmethyl) moiety is attached at the para position to both binding positions of the glycidyl ether groups in two phenyl glycidyl ethers is contained in a ratio of 35% to 100% both inclusive to the total amount of the binuclear compounds as determined by an NMR area ratio;

(B) a curing agent having two or more phenolic hydroxy groups in one molecule;

(C) an inorganic filler; and (D) a curing accelerator, and being substantially free from a halogen-containing compound or antimony compound;

(1)

wherein

R1 and R2, which may be the same or different, represent alkyl having 1 to 4 carbons; a is an integer of 0 to 3; b is an integer of 0 to 4; n is an integer of 1 to 5; and G is glycidyl.

[2] The epoxy resin composition for encapsulating a semiconductor as described in [1], wherein the component (A) is an epoxy resin having an ICI melt viscosity of 0.05 poise to 0.5 poise both inclusive at 150° C. and a softening point of 80° C. to 110° C. both inclusive.

[3] The epoxy resin composition for encapsulating a semiconductor as described in [1], wherein the component (A) is an epoxy resin represented by general formula (2), wherein a binuclear compound (a component in which n=1 in general formula (2)) is contained in a ratio of 60% to 100% both inclusive as determined by a GPC area ratio, and a binuclear compound in which the bis(phenylmethyl) moiety is attached at the para position to both binding positions of the glycidyl ether groups in two phenyl glycidyl ethers is contained in a ratio of 35% to 100% both inclusive to the total amount of the binuclear compounds as determined by an NMR area ratio:

(2)

wherein

R1 and R2, which may be the same or different, represent alkyl having 1 to 4 carbons; a is an integer of 0 to 3; b is an integer of 0 to 4; n is an integer of 1 to 5; and G is glycidyl.

[4] The epoxy resin composition for encapsulating a semiconductor as described in [1], wherein the curing accelerator (D) comprises a curing accelerator (d1) having a cationic moiety capable of accelerating a curing reaction of the epoxy resin and a silicate anionic moiety capable of inhibiting catalytic activity of the cationic moiety accelerating the curing reaction.

[5] The epoxy resin composition for encapsulating a semiconductor as described in [4], wherein the component (d1) is a compound represented by general formula (3):

(3)

wherein

A1 represents nitrogen or phosphorous; R3, R4, R5 and R6, which may be the same or different, independently represent aliphatic group or an organic group having a substituted or unsubstituted aromatic ring or heterocycle; X1 is an organic group linking group Y1 with group Y2; X2 is an organic group linking group Y3 with group Y4; Y1 and Y2, which may be the same or different, are groups resulting from elimination of a proton from a proton-donating substituent and groups Y1 and Y2 in the same molecule are bound to a silicon atom to form a chelate structure; Y3 and Y4 are groups resulting from elimination of a proton from a proton-donating substituent and groups Y3 and Y4 in the same molecule are bound to a silicon atom to form a chelate structure; X1 and X2 may be the same or different; Y1, Y2, Y3 and Y4 may be the same or different; and Z1 represents an organic group having a substituted or unsubstituted aromatic ring or a substituted or unsubstituted heterocycle or a substituted or unsubstituted aliphatic group.

[6] The epoxy resin composition for encapsulating a semiconductor as described in [1], wherein the curing agent (B) having two or more phenolic hydroxy groups in one molecule is a compound represented by general formula (4):

(4)

-continued wherein

B1 is

B2 is n is 0 or an integer of 10 or less.

[7] A semiconductor device, wherein a semiconductor element and/or a semiconductor integrated circuit are encapsulated with a cured product of the epoxy resin composition for encapsulating a semiconductor as described in [1].

This invention provides an epoxy resin composition for encapsulating a semiconductor exhibiting higher flame resistance, good flowability and adequately higher solder-reflow resistance to allow for the use of a lead-free solder without a flame retardant, as well as a highly reliable semiconductor device in which a semiconductor element is encapsulated with a cured product from the composition.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purpose.

This invention provides an epoxy resin composition for encapsulating a semiconductor exhibiting higher flame resistance, good flowability and adequately higher solder-reflow resistance to allow for the use of a lead-free solder without a flame retardant, comprising (A) an epoxy resin represented by general formula (1), wherein a binuclear compound (a component in which n=1 in general formula (1)) is contained in a ratio of 60% to 100% both inclusive as determined by a GPC area ratio, and a binuclear compound in which the bis(phenylmethyl) moiety is attached at the para position to both binding positions of the glycidyl ether groups in two phenyl glycidyl ethers is contained in a ratio of 35% to 100% both inclusive to the total amount of the binuclear compounds as determined by an NMR area ratio; (B) a compound having two or more phenolic hydroxy groups in one molecule; (C) an inorganic filler; and (D) a curing accelerator.

There will be detailed the present invention.

The epoxy resin (A) used in this invention is an epoxy resin represented by general formula (1), wherein a binuclear compound (a component in which n=1 in general formula (1)) is contained in a ratio of 60% to 100% both inclusive as determined by a GPC area ratio, and a binuclear compound in which the bis (phenylmethyl) moiety is attached at the para position to both binding positions of the glycidyl ether groups in two phenyl glycidyl ethers is contained in a ratio of 35% to 100% both inclusive to the total amount of the binuclear compounds as determined by an NMR area ratio. Herein, a binuclear compound in which the bis(phenylmethyl) moiety is attached at the para position to both binding positions of the glycidyl ether groups in two phenyl glycidyl ethers is one having the structure represented by general formula (5); more specifically, those having the structures represented by general formulas (6) and (7).

(1)

wherein

R1 and R2, which may be the same or different, represent alkyl having 1 to 4 carbons; a is an integer of 0 to 3; b is an integer of 0 to 4; n is an integer of 1 to 5; and G is glycidyl.

(5)

wherein

R1 and R2, which may be the same or different, represent alkyl having 1 to 4 carbons; a is an integer of 0 to 3; b is an integer of 0 to 4; and G is glycidyl.

(6)

wherein

R1 and R2, which may be the same or different, represent alkyl having 1 to 4 carbons; a is an integer of 0 to 3; b is an integer of 0 to 4; and G is glycidyl.

(7)

wherein, G is glycidyl.

A phenol aralkyl type epoxy resin having a biphenylene skeleton represented by general formula (1) is well-known perse. A commercially available resin contains a binuclear compound in a low content (for example, NC-3000 from Nippon Kayaku Co., Ltd. is a resin represented by general formula (1) which does not have both of substituents R1 and R2 and its compound containing two aromatic rings content is about 30% as determined as a GPC area ratio.), whereby excellent flowability cannot be achieved and, for example, an inorganic filler cannot be added in a higher concentration for improving solder-reflow resistance. Thus, there is a limitation to meet both requirements of excellent flowability and solder-reflow resistance. When combining a crystalline epoxy resin having a viscosity lower than that of a conventional phenol aralkyl type epoxy resin having a biphenylene skeleton (for example, YX-4000K from Japan Epoxy Resins Co., Ltd. which is a biphenyl type epoxy resin) for solving the problem, it leads to deterioration in flame resistance. When increasing a ratio of a binuclear compound in a phenyl aralkyl type epoxy resin having a biphenylene skeleton, flowability can be improved while retaining excellent flame resistance, but it results in a lower softening point of the epoxy resin. Thus, the resin cannot be a solid at about ambient temperature, leading to significant deterioration in handling properties. A binuclear compound content is, therefore, limited to about 45%.

The epoxy resin (A) used in the present invention is a phenol aralkyl type epoxy resin having a biphenylene skeleton represented by general formula (1) comprising compounds containing two aromatic rings in 60% to 100% both inclusive as determined as a GPC area ratio and a binuclear compound where a bis(phenylmethyl) moiety is attached at a para position to both binding positions of the glycidyl ether groups in two phenyl glycidyl ethers is contained in a ratio of 35% to 100% both inclusive to the total amount of the binuclear compounds as determined as an NMR area ratio. Thus, the resin can be crystalline to be endowed with excellent flowability, so that it can be easily handled at about ambient temperature without problems such as blocking. Furthermore, the epoxy resin (A) is a phenol aralkyl type epoxy resin comprising a biphenylene skeleton represented by general formula (1), which contains a binuclear compound in a ratio of 60% to 100% both inclusive as determined as a GPC area ratio. Thus, it can exhibit excellent flowability while maintaining flame resistance and improve flexibility in a cured product, and is, therefore, advantageous in terms of solder-reflow resistance. Furthermore, freedom in designing can be drastically increased; for example, an inorganic filler can be added in a higher concentration as described above, and it may allow for applying or increasing an adhesion aid such as a silane coupling agent which tends to be reduced flowability, therefore, it cannot be added in a higher content in the related art.

There are no particular restrictions to a process for manufacturing the epoxy resin (A) used in this invention, and for example, it can be prepared by epoxidizing a phenol novolac condensate obtained by reacting each bis(methoxymethyl) biphenyl isomer or a mixture of isomers with a phenol compound. Furthermore, there is not particular difficulty in a method for incorporating a binuclear compound (a component in which n=1 in formula (1)) in a ratio of 60% to 100% both inclusive as determined as a GPC area ratio, and a method for incorporating a binuclear compound in which a bis(phenylmethyl) moiety is attached at a para position to both binding positions to the glycidyl ether groups in two phenyl glycidyl ethers in a ratio of 35% to 100% both inclusive to the total amount of the binuclear compounds as determined as an NMR area ratio in a phenol aralkyl type epoxy resin having a biphenylene skeleton represented by general formula (1), and it can be prepared by selecting, for example, starting materials, a catalyst and the reaction conditions as appropriate.

The epoxy resin (A) used in the present invention has an ICI melt viscosity of preferably 0.05 poise to 0.5 poise both inclusive, more preferably 0.05 poise to 0.3 poise both inclusive at 150° C. and a softening point of preferably 80° C. to 110° C. both inclusive, more preferably 90° C. to 105° C. both inclusive. An ICI melt viscosity is within the above range allows for excellent flowability. A softening point within the above range allows for handling at about ambient temperature without problems such as blocking.

There are no particular restrictions to the epoxy resin (A) used in the present invention, but in the light of meeting both flowability and solder-reflow resistance and mass productivity, preferred is an epoxy resin represented by general formula (2), wherein a binuclear compound (a component in which n=1 in general formula (2)) is contained in a ratio of 60% to 100% both inclusive as determined by a GPC area ratio, and a binuclear compound in which the bis(phenylmethyl) moiety is attached at the para position to both binding positions of the glycidyl ether groups in two phenyl glycidyl ethers is contained in a ratio of 35% to 100% both inclusive to the total amount of the binuclear compounds as determined by an NMR area ratio:

(2)

wherein

R1 and R2, which may be the same or different, represent alkyl having 1 to 4 carbons; a is an integer of 0 to 3; b is an integer of 0 to 4; n is an integer of 1 to 5; and G is glycidyl.

In this invention, another epoxy resin may be combined as long as it does not deteriorate the effects of the use of the epoxy resin (A). Epoxy resins which can be combined are generally monomers, oligomers and polymers having two or more intramolecular epoxy groups, but there are no particular restrictions to their molecular weight or molecular structure. Examples include phenol novolac type epoxy resins, ortho-cresol novolac type epoxy resins, naphthol novolac type epoxy resins, phenol aralkyl type epoxy resins having a biphenylene structure, naphthol aralkyl type epoxy resins having, for example, a phenylene or biphenyl structure, dicyclopentadiene-modified phenol type epoxy resins, stilbene type epoxy resins, triphenolmethane type epoxy resins, alkyl-modified triphenolmethane type epoxy resins and triazine-core containing epoxy resins, which may be used alone or in combination of two or more. When another epoxy resin is combined, a content of the epoxy resin (A) is preferably 70 wt % to 100 wt % both inclusive to the total amount of the epoxy resins. A content of the epoxy resin (A) within the range may result in meeting all the requirements for flowability, flame resistance and solder reflow resistance.

There are no particular restrictions to a molecular weight or molecular structure of the curing agent (B) having two or more phenolic hydroxy groups in one molecule, and specific examples include phenol novolac resins, cresol novolac resins, dicyclopentadiene-modified phenol resins, terpene-modified phenol resin, triphenolmethane type resins, phenol aralkyl resins having, for example, phenylene or biphenylene skeleton, sulfur-containing phenol resins, naphthol novolac resins and naphthol aralkyl resins having, for example, phenylene or biphenylene skeleton; among these, preferred are a compound represented by general formula (4) in the light of lower hygroscopicity and flame resistance after curing the composition. These curing agents may be used alone or in combination of two or more. The components of the curing agent may be mixed to provide a mixed curing agent before use, or alternatively, when mixing various components for preparing an epoxy resin composition, the components of the curing agent for an epoxy resin may be separately added and all the components may be mixed together. The curing agent (B) is used in such an amount that phenolic hydroxy groups in all the curing agents are contained preferably in 0.5 moles to 2.0 moles both inclusive, more preferably in 0.8 moles to 1.2 moles both inclusive to one mole of epoxy groups in all the epoxy resin components. In the light of curability, a hydroxyl equivalent is preferably 90 g/eq to 250 g/eq both inclusive.

(4)

wherein

B1 is

B2 is n is 0 or an integer of 10 or less.

An epoxy resin composition for encapsulating a semiconductor according to the present invention contains an inorganic filler (C). Examples of such an inorganic filler include, but not limited to, fused silica, crystalline silica, glass powder, alumina and calcium carbonate. It may be crashed or spherical. Different inorganic fillers may be used alone or in combination of two or more. Among others, fused silica or crystalline silica is preferable. It can be used preferably in an amount of 85 wt % to 95 wt % both inclusive to the total amount of the composition. The amount of the inorganic filler (C) within the above range may allow for excellent flowability, flame resistance and solder-reflow resistance.

For further improving cured product strength, the inorganic filler may be an inorganic filler whose surface is pre-treated with a silane coupling agent. Examples of a silane coupling agent used for the treatment include, but not limited to, epoxy-containing silane coupling agents, amino-containing silane coupling agents, ureido-containing silane coupling agent and mercapto-containing silane coupling agent as long as they can improve interface strength between an epoxy resin and an inorganic filler. Among these, preferred are amino-containing silane coupling agent are preferable, whose specific examples include, but not limited, γ-aminopropyltriethoxysilane, N-phenyl-γ-aminopropyltrimethoxysilane, N,N-diethyl-γ-aminopropyltrimethoxysilane, γ-aminopropylmethyldiethoxysilane, p-aminophenyltrimethoxysilane, N-β(aminoethyl)γ-aminopropyltrimethoxysilane and N-β(aminoethyl)γ-aminopropylmethyldimethoxysilane.

A curing accelerator (D) used in the present invention is a compound accelerating a curing reaction of epoxy groups in an epoxy resin with phenolic hydroxy groups in a curing agent. Specific examples include organic phosphine compounds, phosphonium salts, imidazole compounds, tertiary amine compounds and diazabicyclo compounds. A particularly preferable curing accelerator is a silicate salt such as the compound represented by general formula (3), which can be combined with the above epoxy resin (A) to provide further improved flowability, flame resistance and solder-reflow resistance.

(3)

wherein

A1 represents nitrogen or phosphorous; R3, R4, R5 and R6, which may be the same or different, independently represent an organic group or aliphatic group having a substituted or unsubstituted aromatic ring or heterocycle; X1 is an organic group linking group Y1 with group Y2; X2 is an organic group linking group Y3 with group Y4; Y1 and Y2, which may be the same or different, are groups resulting from elimination of a proton from a proton-donating substituent and groups Y1 and Y2 in the same molecule are bound to a silicon atom to form a chelate structure; Y3 and Y4 are groups resulting from elimination of a proton from a proton-donating substituent and groups Y3 and Y4 in the same molecule are bound to a silicon atom to form a chelate structure; X1 and X2 may be the same or different; Y1, Y2, Y3 and Y4 may be the same or different; and Z1 represents an organic group having a substituted or unsubstituted aromatic ring or a substituted or unsubstituted heterocycle or a substituted or unsubstituted aliphatic group.

There will be described a silicate salt.

The silicate salt has a cationic moiety capable of accelerating a curing reaction of the epoxy resin and a silicate anionic moiety capable of inhibiting catalytic activity of the cationic moiety accelerating the curing reaction, and the silicate anionic moiety is not dissociated at a temperature lower than a temperature range for the curing reaction of the epoxy resin composition (about 150 to 200° C.), so that it can inhibit acceleration of the curing reaction by the cationic moiety.

In addition, the silicate anionic moiety has extremely low nucleophilicity and the silicate salt does not easily initiate or accelerate the curing reaction of the epoxy resin with the curing agent in a low temperature range, so that it can endow an epoxy resin composition with excellent properties in flowability and storage stability at the same time.

The silicate anionic moiety is dissociated, for example, due to breakage of a chelate bond by heating during the curing reaction and the silicate moiety is incorporated into the resin to lose its ability of inhibiting curing accelerating activity of the cationic moiety and to allow the free cationic moiety to accelerate the curing reaction, so that it can allow for excellent flowability and curability at the same time. When using an intramolecular or extramolecular salt of an onium cation and a borate anion such as a common onium borate salt used in the related art, the borate anion with extremely lower nucleophilicity still exists in the course of a curing process, leading to lower curability.

The above silicate salt may have a structure (type) as, in addition to a simple salt formed by ion bonding between an anionic moiety and a cationic moiety, a complex formed by coordination of excessive anionic moiety or cationic moiety, a complex salt and compound formed by a non-covalent bond such as a molecular compound, all of which are within the present invention as long as they have a cationic moiety capable of accelerating a curing reaction of a curable resin and an anionic moiety capable of inhibiting the above catalytic activity accelerating the curing reaction.

The cationic moiety in the silicate salt contains nitrogen, phosphorous, sulfur or iodine, preferably contains nitrogen or phosphorous cation in the light of catalytic activity. Such a cationic moiety may be derived from a tertiary phosphine, a phosphonium salt, a tertiary amine and an ammonium salt used as a curing accelerator for a curable resin, preferably an onium salt such as a phosphonium salt and an ammonium salt.

There will be described a compound represented by general formula (3).

In the compound represented by general formula (3), the atom A1 is nitrogen or phosphorous; and the substituents R3, R4, R5 and R6 bound to the atom A1, which may be the same or different, independently represent an organic group or aliphatic group having a substituted or unsubstituted aromatic ring or heterocycle.

Examples of these substituents R3, R4, R5 and R6 include phenyl, methylphenyl, methoxyphenyl, hydroxyphenyl, benzyl, methyl, ethyl, n-butyl, n-octyl and cyclohexyl, more preferably phenyl, methylphenyl, methoxyphenyl and hydroxyphenyl in the light of reactivity and stability.

In the compound represented by general formula (3), X1 is an organic group linking group Y1 with group Y2. Similarly, X2 is an organic group linking group Y3 with group Y4. The groups Y1 and Y2, which may be the same or different, are groups resulting from elimination of a proton from a proton-donating substituent and groups Y1 and Y2 in the same molecule are bound to a silicon atom to form a chelate structure. Similarly, the groups Y3 and Y4 are groups resulting from elimination of a proton from a proton-donating substituent and groups Y3 and Y4 in the same molecule are bound to a silicon atom to form a chelate structure. The organic groups X1 and X2 may be the same or different, and the groups Y1, Y2, Y3 and Y4 may be the same or different.

The groups represented by —Y1-X1-Y2- and —Y3-X2-Y4- in such a compound represented by general formula (3) are those formed by elimination of two protons from a bivalent or more proton donator. Examples of the bivalent or more proton donator include catechol, pyrogallol, 1,2-dihydroxynaphthalene, 2,3-dihydroxynaphthalene, 2,2'-biphenol, 2,2'-binaphthol, salicylic acid, 1-hydroxy-2-naphthoic acid, 3-hydroxy-2-naphthoic acid, chloranilic acid, tannic acid, 2-hydroxybenzyl alcohol, 1,2-cyclohexanediol, 1,2-propanediol and glycerol. Among these are more preferred catechol, 2,3-dihydroxynaphthalene, 2,2'-biphenol and 3-hydroxy-2-naphthoic acid in the light of storage stability and reliability in moisture resistance.

Z1 in the compound represented by general formula (3) represents an organic group having a substituted or unsubstituted aromatic ring or a substituted or unsubstituted heterocycle or a substituted or unsubstituted aliphatic group. Specific examples of these groups include aliphatic hydrocarbons such as methyl, ethyl, propyl, butyl, hexyl and octyl; aromatic hydrocarbons such as phenyl, benzyl, naphthyl and biphenyl; and reactive substituents such as glycidyloxypropyl, mercaptopropyl, aminopropyl and vinyl. Among these are more preferred methyl, phenyl, naphthyl and biphenyl in the light of thermal stability.

The silicate salt has significantly improved properties as a curing accelerator, particularly curability and flowability in comparison with a conventional curing accelerator, and can be combined with the above epoxy resin having a biphenylene skeleton with a higher compound containing two aromatic rings content, to allow for a higher level of composition designing.

Although the epoxy resin composition of this invention contains components (A) to (D) as main components, it may, if necessary, contain additives including a mold release such as a natural wax including carnauba wax, a synthetic wax (for example, polyethylene wax), a higher fatty acid and its metal salt (for example, stearic acid and zinc stearate), and paraffin; a coloring agent such as carbon black and colcothar; an ion trap such as hydrotalcites and a hydroxide of a metal (for example, magnesium, aluminum, bismuth, titanium and zirconium); a low-stress additive such as silicone oil and rubber; an adhering agent such as thiazoline, diazole, triazole, triazine and pyrimidine; and a flame retardant such as brominated epoxy resins and antimony trioxide, aluminum hydroxide, magnesium hydroxide, zinc borate, zinc molybdate and phosphazene as appropriate.

The epoxy resin composition of this invention may use a mixture prepared by homogeneously mixing components (A) to (D) and other additives at an ambient temperature by a mixer, or a composition prepared by melt-kneading the mixture using a kneading machine such as a heating roller, a kneader and an extruder and then milling the product after cooling, whose dispersity and/or flowability may be, if necessary, adjusted as appropriate.

For preparing a semiconductor device by encapsulating a semiconductor element with a cured product of the epoxy resin composition of this invention, the epoxy resin composition can be used for encapsulating/molding by a molding process such as transfer molding, compression molding and injection molding.

Examples of a semiconductor chip to be encapsulated include, but not limited to, an integrated circuit, a large-scale integrated circuit, a transistor, a thyristor, a diode and a solid-state image sensing device, and the semiconductor device may have any shape without particular restrictions. A semiconductor device encapsulated by a process such as low-pressure transfer molding is completely cured as such or at a temperature of 80 to 200° C. over 15 sec to 10 hours, and then mounted on, for example, an electronic device.

A semiconductor device according to the present invention may have any shape including, but not limited to, dual inline package (DIP), plastic-leaded chip carrier (PLCC), quad flat package (QFP), small outline package (SOP), small outline J-leaded package (SOJ), thin small outline package (TSOP), thin quad flat package (TQFP), tape carrier package (TCP), ball grid array (BGA) and chip size package (CSP).

Figure 1:
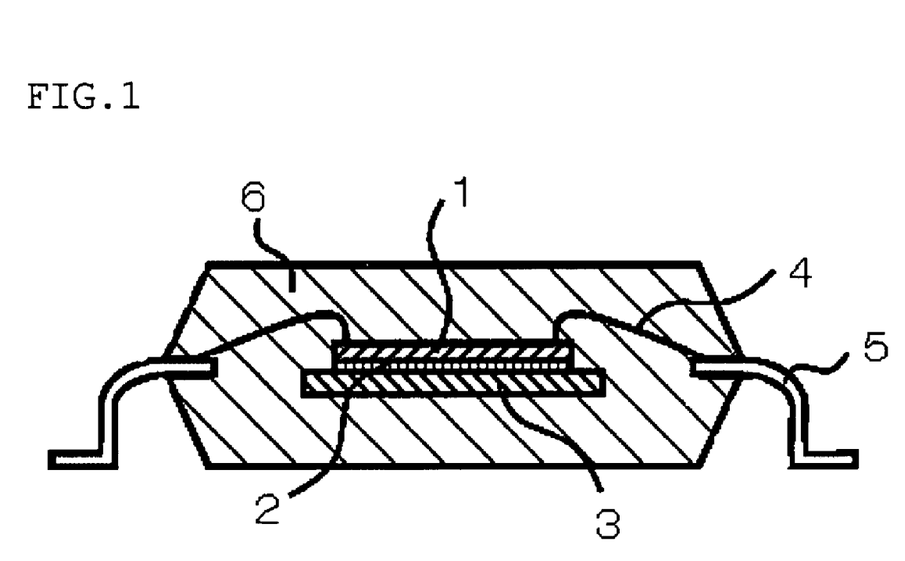
FIG. 1 shows a cross-sectional structure of an embodiment of a semiconductor device prepared using an epoxy resin composition according to the present invention.

FIG. 1 shows a cross-sectional view of an embodiment of a semiconductor device prepared using an epoxy resin composition according to the present invention. In the figure, a semiconductor element 1 is fixed on a die pad 3 via a cured die-bond material 2. A gold wire 4 connects between an electrode pad in the semiconductor element 1 and a lead frame 5. The semiconductor element 1 is encapsulated with a cured product of a encapsulating resin composition 6.

EXAMPLES

This invention will be described with reference to, but not limited to, Examples. Here, any content shall be expressed as part(s) by weight.

There will be illustrated a synthetic process for curing accelerator 1 as an example, but the present invention is not limited to the example.

Synthetic Method for Curing Accelerator 1

To a flask charged with 1800 g of methanol were added 249.5 g of phenyltrimethoxysilane and 384.0 g of 2,3-dihydroxynaphthalene. After dissolving them, to the mixture was added dropwise 231.5 g of a 28% solution of sodium methoxide in methanol with stirring at room temperature. Then, to the resulting mixture was added 503.0 g of pre-formed tetraphenylphosphonium bromide dissolved in 600 g of methanol with stirring at room temperature, resulting in precipitation of crystals. The precipitated crystals were filtered, washed with water and dried under vacuum to give curing accelerator 1 as pink-white crystals.

Example 1

Epoxy resin 1: an epoxy resin represented by general formula (8), that is, a phenolaralkyl type epoxy resin having a biphenylene skeleton, wherein a binuclear compound (n=1) is contained in a ratio of 70% as determined by a GPC area ratio, and a binuclear compound in which the bis(phenylmethyl) moiety is attached at the para position to both binding positions of the glycidyl ether groups in two phenyl glycidyl ethers is contained in a ratio of 40% to the total amount of the binuclear compounds as determined by an NMR area ratio, that at the ortho position to both binding positions is contained in a ratio of 15% to the total amount of the binuclear compounds as determined by an NMR area ratio, and that at the para position to one binding position and at the ortho position to the other binding position is contained in a ratio of 45% to the total amount of the binuclear compounds as determined by an NMR area ratio (ICI melt viscosity at 150° C.: 0.2 poise, softening point: 95° C., epoxy equivalent: 259): 6.70 parts by weight

(8)

Curing agent 1: a phenolaralkyl type resin having a biphenylene skeleton (Meiwa Plastic Industries, Ltd., trade name: MEH-7851SS, softening point: 107° C., hydroxyl equivalent: 204): 4.80 parts by weight Fused spherical silica 1: (average particle size: 22 μm, specific surface area: 3.0 m²/g): 72.00 parts by weight Fused spherical silica 2: (average particle size 0.5 μm, specific surface area: 6.0 m²/g): 15.00 parts by weight Curing accelerator 1: a curing accelerator represented by formula (9): 0.50 parts by weight Silane coupling agent: γ-mercaptopropyltrimethoxysilane: 0.30 parts by weight Carnauba wax: 0.30 parts by weight Carbon black: 0.40 parts by weight These components were blended by a mixer. Then, the mixture was kneaded using two rolls whose surface temperatures were 90° C. and 25° C. After cooling, the mixture was milled to give an epoxy resin composition. The epoxy resin before the kneading and the epoxy resin composition thus obtained were evaluated for their properties by the following method. The results are shown in Table 1.

Evaluation Method

Handling properties of an epoxy resin: an epoxy resin powder after pulverization was left at 25° C. for 24 hours, and evaluated as BB when blocking was observed or as AA when blocking was not observed. An epoxy resin with blocking cannot be industrially used because it leads to decrease in productivity and fluctuating properties due to uneven dispersion.

Spiral flow: Using a low-pressure transfer molding machine (Kohtaki Precision Machine Co., Ltd., KTS-15), the above epoxy resin composition was injected into a mold for measuring a spiral flow in accordance with EMMI-1-66 under the conditions of a mold temperature of 175° C., an injection pressure of 6.9 MPa and a curing time of 120 sec to determine a flow length, which is expressed in cm.

Shore D hardness: Using a low-pressure transfer molding machine (Fujiwa Seiki Co., Ltd., TEP-50-30), the above epoxy resin composition was molded into a test piece (20 mm×6 mm×4 mm (thickness)) under the conditions of a mold temperature of 175° C., an injection pressure of 9.8 MPa and a curing time of 120 sec, and 10 sec after opening the mold, a shore D hardness was determined for evaluating curability. When a shore D hardness as a measure of curability is 80 or more, defective molding can be prevented.

Gold-wire sweeping ratio: Using a low-pressure transfer molding machine (Scinex Co., Ltd., YKC), the above epoxy resin composition was molded/encapsulated into a 208-pin QFP (copper frame: 28 mm×28 mm×3.2 mm (thickness), pad size: 11 mm×11 mm, chip size: 7 mm×7 mm×0.35 mm (thickness)) under the conditions of a mold temperature of 175° C., an injection pressure of 9.8 MPa and a curing time of 90 sec, and post-cured at 175° C. for 2 hours. After cooling to room temperature, the sample was observed by a soft X-ray fluoroscope to determine a ratio of (sweep amount)/(gold wire length) as a gold-wire sweeping ratio, and a value of the gold wire with the maximum ratio was recorded in %. If the value is over 5%, contact between adjacent gold wires probably occurs.

Flame resistance: Using a transfer molding machine (Kohtaki Precision Machine Co., Ltd., KTS-30), the above epoxy resin composition was molded into a test piece (127 mm×12.7 mm×3.2 mm (thickness) or 1.6 mm (thickness)) under the conditions of a molding temperature of 175° C., an injection pressure of 9.8 MPa and a curing time of 120 sec, and then as after-baking, heated at 175° C. for 8 hours. ΣF and $F_{max}$ were determined in accordance with the UL-94 vertical test for evaluating flame resistance.

Solder-reflow resistance: Using a low-pressure transfer auto-molding machine (Daiichi Seiko Co., Ltd., GP-ELF), the above epoxy resin was molded/encapsulated into a 176pLQFP (copper frame: 24 mm×24 mm×1.4 mm (thickness), pad size: 9.5 mm×9.5 mm, chip size: 7 mm×7 mm×0.35 mm (thickness)) under the conditions of a mold temperature of 175° C., an injection pressure of 9.8 MPa and a curing time of 90 sec, and then post-cured at 175° C. for 4 hours. Each of 16 samples was processed at a temperature of 85° C. and a relative humidity of 85% for 168 hours, and then treated by IR reflow (260° C.) for 10 sec. It was observed by a scanning acoustic tomography (SAT) to determine the presence of internal cracks and various interfacial de-lamination. A sample with one internal crack or interfacial de-lamination was rejected as a defective package. When the number of defective packages is n, the result is expressed as n/16.

Examples 2 to 11 and Comparative Examples 1 to 8

According to the compounding rates in Tables 1 and 2, epoxy resin compositions were prepared and evaluated as described in Example 1. The results are shown in Tables 1 and 2.

Starting materials used in Examples other than Example 1 are as follows.

Epoxy resin 2: an epoxy resin represented by general formula (8), that is, a phenolaralkyl type epoxy resin having a biphenylene skeleton, wherein a binuclear compound (n=1) is contained in a ratio of 85% as determined by a GPC area ratio, and a binuclear compound in which the bis (phenylmethyl) moiety is attached at the para position to both binding positions of the glycidyl ether groups in two phenyl glycidyl ethers is contained in a ratio of 50% to the total amount of the binuclear compounds as determined by an NMR area ratio, that at the ortho position to both binding positions is contained in a ratio of 5% to the total amount of the binuclear compounds as determined by an NMR area ratio, and that at the para position to one binding position and at the ortho position to the other binding position is contained in a ratio of 45% to the total amount of the binuclear compounds as determined by an NMR area ratio (ICI melt viscosity at 150° C.: 0.1 poise, softening point: 98° C., epoxy equivalent: 250)

Epoxy resin 3: an epoxy resin represented by general formula (8), that is, a phenolaralkyl type epoxy resin having a biphenylene skeleton, wherein a binuclear compound (n=1) is contained in a ratio of 30% as determined by a GPC area ratio, and a binuclear compound in which the bis(phenylmethyl) moiety is attached at the para position to both binding positions of the glycidyl ether groups in two phenyl glycidyl ethers is contained in a ratio of 25% to the total amount of the binuclear compounds as determined by an NMR area ratio, that at the ortho position to both binding positions is contained in a ratio of 30% to the total amount of the binuclear compounds as determined by an NMR area ratio, and that at the para position to one binding position and at the ortho position to the other binding position is contained in a ratio of 45% to the total amount of the binuclear compounds as determined by an NMR area ratio (Nippon Kayaku Co., Ltd., NC3000, ICI melt viscosity at 150° C.: 1.1 poise, softening point: 58° C., epoxy equivalent: 274)

Curing agent 2: a para-xylene modified novolac type phenol resin(Mitsui Chemicals, Inc., XLC-4L, hydroxyl equivalent: 168, softening point: 62° C.)

Curing agent 3: a β-naphthol aralkyl resin having a phenylene skeleton (Tohto Kasei Co., Ltd., SN-160L, hydroxyl equivalent: 178, softening point: 62° C.)

Curing accelerator 2: a curing accelerator represented by formula (11)

(8)

Epoxy resin 4: an epoxy resin represented by formula (10) (softening point: 53° C., epoxy equivalent: 236)

(10)

Epoxy resin 5: a bisphenol-A type crystalline epoxy resin (Japan Epoxy Resins Co., Ltd., YL6810, epoxy equivalent: 171, melting point: 45° C.)

Epoxy resin 6: a biphenyl type crystalline epoxy resin (Japan Epoxy Resins Co., Ltd., YX-4000K, epoxy equivalent: 185, melting point: 105° C.)

Epoxy resin 7: an epoxy resin represented by general formula (8), that is, a phenolaralkyl type epoxy resin having a biphenylene skeleton, wherein a binuclear compound (n=1) is contained in a ratio of 70% as determined by a GPC area ratio, and a binuclear compound in which the bis(phenylmethyl) moiety is attached at the para position to both binding positions of the glycidyl ether groups in two phenyl glycidyl ethers is contained in a ratio of 25% to the total amount of the binuclear compounds as determined by an NMR area ratio, that at the ortho position to both binding positions is contained in a ratio of 30% to the total amount of the binuclear compounds as determined by an NMR area ratio, and that at the para position to one binding position and at the ortho position to the other binding position is contained in a ratio of 45% to the total amount of the binuclear compounds as determined by an NMR area ratio (ICI melt viscosity at 150° C.: 0.2 poise, softening point: 81° C., epoxy equivalent: 255)

(11)

Curing accelerator 3: a curing accelerator represented by formula (12)

(12)

Curing accelerator 4: a curing accelerator represented by formula (13) wherein m=1

(8)

(13)

Curing accelerator 5: a curing accelerator represented by formula (14)

(14)

TABLE 1

|  | Examples | | | | | | | | | | |
| --- | --- | --- | --- | --- | --- | --- | --- | --- | --- | --- | --- |
|  | 1 | 2 | 3 | 4 | 5 | 6 | 7 | 8 | 9 | 10 | 11 |
| Epoxy resin 1 | 6.70 | 6.85 | 5.53 | 5.68 | 3.83 | 5.98 | 5.85 | 5.54 | 5.54 |  | 6.85 |
| Epoxy resin 2 |  |  |  |  |  |  |  |  |  | 6.61 |  |
| Epoxy resin 4 |  |  |  |  | 1.64 |  |  |  |  |  |  |
| Curing agent 1 | 4.80 | 4.90 | 3.97 | 4.07 | 4.03 |  |  | 3.96 | 3.96 | 4.89 | 4.90 |
| Curing agent 2 |  |  |  |  |  | 3.52 |  |  |  |  |  |
| Curing agent 3 |  |  |  |  |  |  | 3.65 |  |  |  |  |
| Fused spherical silica 1 | 72.00 | 72.00 | 74.00 | 74.00 | 74.00 | 74.00 | 74.00 | 74.00 | 74.00 | 72.00 | 72.00 |
| Fused spherical silica 2 | 15.00 | 15.00 | 15.00 | 15.00 | 15.00 | 15.00 | 15.00 | 15.00 | 15.00 | 15.00 | 15.00 |
| Curing accelerator 1 | 0.50 |  | 0.50 |  | 0.50 | 0.50 | 0.50 |  |  | 0.50 |  |
| Curing accelerator 2 |  |  |  |  |  |  |  | 0.50 |  |  |  |
| Curing accelerator 3 |  |  |  |  |  |  |  |  | 0.50 |  |  |
| Curing accelerator 4 |  | 0.25 |  | 0.25 |  |  |  |  |  |  |  |
| Curing accelerator 5 |  |  |  |  |  |  |  |  |  |  | 0.25 |
| Silane coupling agent | 0.30 | 0.30 | 0.30 | 0.30 | 0.30 | 0.30 | 0.30 | 0.30 | 0.30 | 0.30 | 0.30 |
| Carnauba wax | 0.30 | 0.30 | 0.30 | 0.30 | 0.30 | 0.30 | 0.30 | 0.30 | 0.30 | 0.30 | 0.30 |
| Carbon black | 0.40 | 0.40 | 0.40 | 0.40 | 0.40 | 0.40 | 0.40 | 0.40 | 0.40 | 0.40 | 0.40 |
| Handling properties of an epoxy resin | AA | AA | AA | AA | AA | AA | AA | AA | AA | AA | AA |
| Spiral flow [cm] | 152 | 131 | 133 | 110 | 135 | 149 | 133 | 143 | 141 | 164 | 115 |
| Shore D hardness | 83 | 81 | 87 | 83 | 89 | 89 | 86 | 81 | 88 | 80 | 75 |
| Gold-wire sweeping ratio [%] | 2.1 | 3.0 | 2.9 | 4.7 | 3.0 | 2.7 | 2.8 | 2.6 | 2.7 | 1.9 | 4.1 |
| Flameresistance (3.2 nm thickness) | V-0 | V-0 | V-0 | V-0 | V-0 | V-0 | V-0 | V-0 | V-0 | V-0 | V-0 |
| Flameresistance (1.6 nm thickness) | V-0 | V-0 | V-0 | V-0 | V-0 | V-0 | V-0 | V-0 | V-0 | V-0 | V-0 |
| Solder reflow resistance — Crack defect | 0/16 | 0/16 | 0/16 | 0/16 | 0/16 | 0/16 | 0/16 | 0/16 | 0/16 | 0/16 | 0/16 |
| Solder reflow resistance — De-lamination defect | 0/16 | 0/16 | 0/16 | 0/16 | 0/16 | 0/16 | 0/16 | 0/16 | 0/16 | 0/16 | 0/16 |

TABLE 2

|  | Comparable Examples | | | | | | | |
| --- | --- | --- | --- | --- | --- | --- | --- | --- |
|  | 1 | 2 | 3 | 4 | 5 | 6 | 7 | 8 |
| Epoxy resin 3 | 6.85 | 7.00 | 5.67 | 7.00 | 3.06 | 3.12 | 2.59 |  |
| Epoxy resin 5 |  |  |  |  | 3.06 |  |  |  |
| Epoxy resin 6 |  |  |  |  |  | 3.12 | 2.59 |  |
| Epoxy resin 7 |  |  |  |  |  |  |  | 6.67 |
| Curing agent 1 | 4.65 | 4.75 | 3.83 | 4.75 | 5.38 | 5.26 | 4.32 | 4.83 |
| Fused spherical silica 1 | 72.00 | 72.00 | 74.00 | 72.00 | 72.00 | 72.00 | 74.00 | 72.00 |
| Fused spherical silica 2 | 15.00 | 15.00 | 15.00 | 15.00 | 15.00 | 15.00 | 15.00 | 15.00 |
| Curing accelerator 1 | 0.50 |  | 0.50 |  | 0.50 | 0.50 | 0.50 | 0.50 |
| Curing accelerator 4 |  | 0.25 |  |  |  |  |  |  |
| Curing accelerator 5 |  |  |  | 0.25 |  |  |  |  |
| Silane coupling agent | 0.30 | 0.30 | 0.30 | 0.30 | 0.30 | 0.30 | 0.30 | 0.30 |
| Carnauba wax | 0.30 | 0.30 | 0.30 | 0.30 | 0.30 | 0.30 | 0.30 | 0.30 |
| Carbon black | 0.40 | 0.40 | 0.40 | 0.40 | 0.40 | 0.40 | 0.40 | 0.40 |
| Handling properties of an epoxy resin | AA | AA | AA | AA | AA | AA | AA | BB |
| Spiral flow [cm] | 122 | 98 | 111 | 84 | 143 | 139 | 124 | Failed to prepare a |
| Shore D hardness | 86 | 85 | 88 | 84 | 82 | 81 | 83 |  |

TABLE 2-continued

|  |  | Comparable Examples | | | | | | | |
|---|---|---|---|---|---|---|---|---|---|
|  |  | 1 | 2 | 3 | 4 | 5 | 6 | 7 | 8 |
| Gold-wire sweeping ratio [%] | | 3.9 | 5.6 | 4.9 | 6.3 | 2.8 | 3.0 | 3.5 | resin material |
| Flame resistance (3.2 nm thickness) | | V-0 | V-0 | V-0 | V-0 | V-1 | V-1 | V-0 | |
| Flame resistance (1.6 nm thickness) | | V-0 | V-0 | V-0 | V-0 | V-1 | V-1 | V-1 | |
| Solder reflow resistance | Crack defect | 9/16 | 8/16 | 0/16 | 0/16 | 16/16 | 16/16 | 0/16 | |
|  | De-lamination defect | 16/16 | 16/16 | 16/16 | 0/16 | 16/16 | 16/16 | 16/16 | |

Examples 1 to 11 contain an epoxy resin represented by general formula (1), wherein a binuclear compound (a component in which n=1 in general formula (1)) is contained in a ratio of 60% to 100% both inclusive as determined by a GPC area ratio, and a binuclear compound in which the bis(phenylmethyl) moiety is attached at the para position to both binding positions of the glycidyl ether groups in two phenyl glycidyl ethers is contained in a ratio of 35% to 100% both inclusive to the total amount of the binuclear compounds as determined by an NMR area ratio, varying the type and a content of the epoxy resin (A), the type of the curing agent (B), a content of the inorganic filler (C), the type of the curing accelerator (D) and so on. All of these exhibited excellent flowability (spiral flow), gold-wire sweeping ratio, flame resistance and solder-reflow resistance. Examples 1 to 10 containing the compound represented by general formula (3) or the curing accelerator represented by formula (13) as the curing accelerator (D) also exhibited excellent curability (shore D hardness).

On the other hand, Comparable Examples 1 to 3 containing, instead of the epoxy resin (A) of the present invention, epoxy resin 3, that is, an epoxy resin represented by general formula (1), wherein a binuclear compound (a component in which n=1 in general formula (1)) is contained in a ratio of less than 60% as determined by a GPC area ratio, and a binuclear compound in which the bis (phenylmethyl) moiety is attached at the para position to both binding positions of the glycidyl ether groups in two phenyl glycidyl ethers is contained in a ratio of less than 35% to the total amount of the binuclear compounds as determined by an NMR area ratio were inferior in flowability, a gold-wire sweeping ratio and solder-reflow resistance to the corresponding examples (Comparative Example vs Example 1, Comparative Example 2 vs Example 2, Comparative Example 3 vs Example 3). Furthermore, Comparative Example 4 containing curing accelerator 5 as a curing accelerator was improved in solder-reflow resistance owing to its elastic-modulus reducing effect while being significantly inferior in flowability and a gold-wire sweeping ratio. Comparative Examples 5 and 6 containing a crystalline epoxy resin such as epoxy resin 5 (bisphenol-A type epoxy resin) and epoxy resin 6 (biphenyl type epoxy resin) as an epoxy resin were improved in flowability and a gold-wire sweeping ratio while being inferior in solder-reflow resistance significantly and in flame resistance. Comparative Example 7 in which a content of the inorganic filler (C) was increased by 2% was also inferior in solder-reflow resistance and unsatisfactory in flame resistance. Furthermore, in contrast to epoxy resin (A) of the present invention, epoxy resin 7, that is, an epoxy resin represented by general formula (1) wherein a binuclear compound (a component in which n=1 in general formula (1)) is contained in a ratio of 60% or more (70%) as determined by a GPC area ratio, but a binuclear compound in which the bis (phenylmethyl) moiety is attached at the para position to both binding positions of the glycidyl ether groups in two phenyl glycidyl ethers is contained in a ratio of less than 35% (20%) to the total amount of the binuclear compounds as determined by an NMR area ratio caused adhesion in a pulverizer during grinding and after grinding gave a powder which immediately caused blocking, leading to extremely deteriorated handling properties. Thus, it failed to give an epoxy resin composition.

As described above, even an epoxy resin represented by general formula (1) does not meet the requirements for flowability, a gold-wire sweeping ratio, flame resistance and solder-reflow resistance if a ratio of a binuclear compound and a ratio of a component having a particular orientation in a binuclear compound are not within the ranges defined in the present invention, with changing the type of a curing accelerator and combination with another epoxy resin being ineffective. The foregoing description has shown effectiveness of using the epoxy resin (A) of the present invention represented by general formula (1), wherein a binuclear compound (a component in which n=1 in general formula (1)) is contained in a ratio of 60% to 100% both inclusive as determined by a GPC (Gel Permeation Chromatography) area ratio, and a binuclear compound in which the bis(phenylmethyl) moiety is attached at the para position to both binding positions of the glycidyl ether groups in two phenyl glycidyl ethers is contained in a ratio of 35% to 100% both inclusive to the total amount of the binuclear compounds as determined by an NMR area ratio.

It is apparent that the present invention is not limited to the above embodiment, that may be modified and changed without departing from the scope and spirit of the invention.

What is claimed is:

1. An epoxy resin composition for encapsulating a semiconductor comprising
    (A) an epoxy resin represented by general formula (1), wherein a binuclear compound (a component in which n=1 in general formula (1)) is contained in a ratio of 60% to 100% both inclusive as determined by a GPC area ratio, and a binuclear compound in which the bis(phenylmethyl) moiety is attached at the para position to both binding positions of the glycidyl ether groups in two phenyl glycidyl ethers is contained in a ratio of 35% to 100% both inclusive to the total amount of the binuclear compounds as determined by an NMR area ratio;
    (B) a curing agent having two or more phenolic hydroxy groups in one molecule;
    (C) an inorganic filler; and
    (D) a curing accelerator, and being substantially free from a halogen-containing compound or antimony compound;

wherein
R1 and R2, which may be the same or different, represent alkyl having 1 to 4 carbons; a is an integer of 0 to 3; b is an integer of 0 to 4; n is an integer of 1 to 5; and G is glycidyl.

2. The epoxy resin composition for encapsulating a semiconductor as claimed in claim 1, wherein the component (A) is an epoxy resin having an ICI melt viscosity of 0.05 poise to 0.5 poise both inclusive at 150° C. and a softening point of 80° C. to 110° C. both inclusive.

3. The epoxy resin composition for encapsulating a semiconductor as claimed in claim 1, wherein the component (A) is an epoxy resin represented by general formula (2), wherein a binuclear compound (a component in which n=1 in general formula (2)) is contained in a ratio of 60% to 100% both inclusive as determined by a GPC area ratio, and a binuclear compound in which the bis(phenylmethyl) moiety is attached at the para position to both binding positions of the glycidyl ether groups in two phenyl glycidyl ethers is contained in a ratio of 35% to 100% both inclusive to the total amount of the binuclear compounds as determined by an NMR area ratio:

wherein
R1 and R2, which may be the same or different, represent alkyl having 1 to 4 carbons; a is an integer of 0 to 3; b is an integer of 0 to 4; n is an integer of 1 to 5; and G is glycidyl.

4. The epoxy resin composition for encapsulating a semiconductor as claimed in claim 1, wherein the curing accelerator (D) comprises a curing accelerator (d1) having a cationic moiety capable of accelerating a curing reaction of the epoxy resin and a silicate anionic moiety capable of inhibiting catalytic activity of the cationic moiety accelerating the curing reaction.

5. The epoxy resin composition for encapsulating a semiconductor as claimed in claim 4, wherein the component (d1) is a compound represented by general formula (3):

wherein
A1 represents nitrogen or phosphorous; R3, R4, R5 and R6, which may be the same or different, independently represent an organic group or aliphatic group having a substituted or unsubstituted aromatic ring or heterocycle; X1 is an organic group linking group Y1 with group Y2; X2 is an organic group linking group Y3 with group Y4; Y1 and Y2, which may be the same or different, are groups resulting from elimination of a proton from a proton-donating substituent and groups Y1 and Y2 in the same molecule are bound to a silicon atom to form a chelate structure; Y3 and Y4 are groups resulting from elimination of a proton from a proton-donating substituent and groups Y3 and Y4 in the same molecule are bound to a silicon atom to form a chelate structure; X1 and X2 may be the same or different; Y1, Y2, Y3 and Y4 may be the same or different; and Z1 represents an organic group having a substituted or unsubstituted aromatic ring or a substituted or unsubstituted heterocycle or a substituted or unsubstituted aliphatic group.

6. The epoxy resin composition for encapsulating a semiconductor as claimed in claim 1, wherein the curing agent (B) having two or more phenolic hydroxy groups in one molecule is a compound represented by general formula (4):

n is 0 or an integer of 10 or less.

7. A semiconductor device, wherein a semiconductor element and/or a semiconductor integrated circuit are encapsulated with a cured product of the epoxy resin composition for encapsulating a semiconductor as claimed in claim 1.

* * * * *